United States Patent [19]

Allina

[11] Patent Number: 4,866,560
[45] Date of Patent: Sep. 12, 1989

[54] SAFEGUARDING ELECTRICAL TRANSIENT SURGE PROTECTION

[76] Inventor: Edward F. Allina, 605 Capri Blvd., Treasure Island, Fla. 33706

[21] Appl. No.: 185,587

[22] Filed: Apr. 22, 1988

[51] Int. Cl.[4] ............................................. H02H 3/20
[52] U.S. Cl. .................................... 361/104; 361/56; 361/91; 361/117; 361/119
[58] Field of Search .................. 361/56, 91, 103, 117, 361/118, 119, 124, 104, 400, 405; 174/52.2, 52.3

[56] References Cited

U.S. PATENT DOCUMENTS

| | | | |
|---|---|---|---|
| 4,089,032 | 5/1978 | Dell Orfano | 361/111 X |
| 4,477,857 | 10/1984 | Crocker | 361/124 X |
| 4,527,215 | 7/1985 | Wessing | 361/124 |
| 4,639,820 | 1/1987 | Dolansky et al. | 361/124 |
| 4,641,218 | 2/1987 | Scalera | 361/119 |
| 4,642,723 | 2/1987 | Achtrig et al. | 361/124 |
| 4,723,190 | 2/1988 | Chung | 361/124 X |
| 4,736,269 | 4/1988 | Amein et al. | 361/124 X |

Primary Examiner—Derek S. Jennings
Attorney, Agent, or Firm—Charles A. McClure

[57] ABSTRACT

Electrical transient surge protection plus safeguarding of surge-protection apparatus against failure at high temperature. Thermally sensitive fusible devices are used in conjunction with voltage-limiting devices, specifically varistors, so as to protect watt-hour meters and downstream loads from electrical surges, and to safeguard such varistors from overheating and possibly failing. Such apparatus may be located in such diverse places as a power line weatherhead, a watt-hour meter base, an adapter between a meter base and its normal mounting socket, or a circuit-breaker panel downstream of the meter and upstream of electrical loads metered thereby.

19 Claims, 3 Drawing Sheets

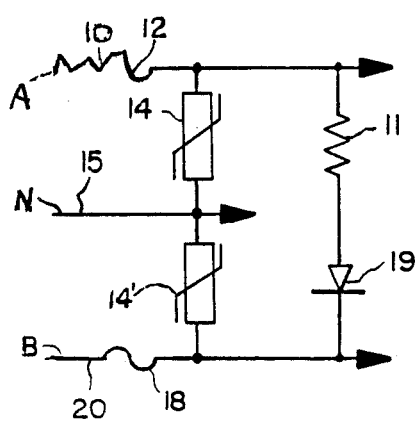
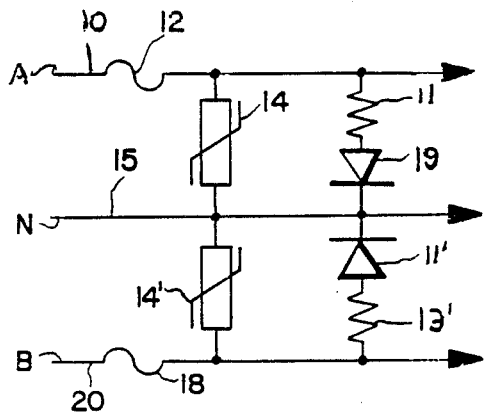
Fig. 1    Fig. 2
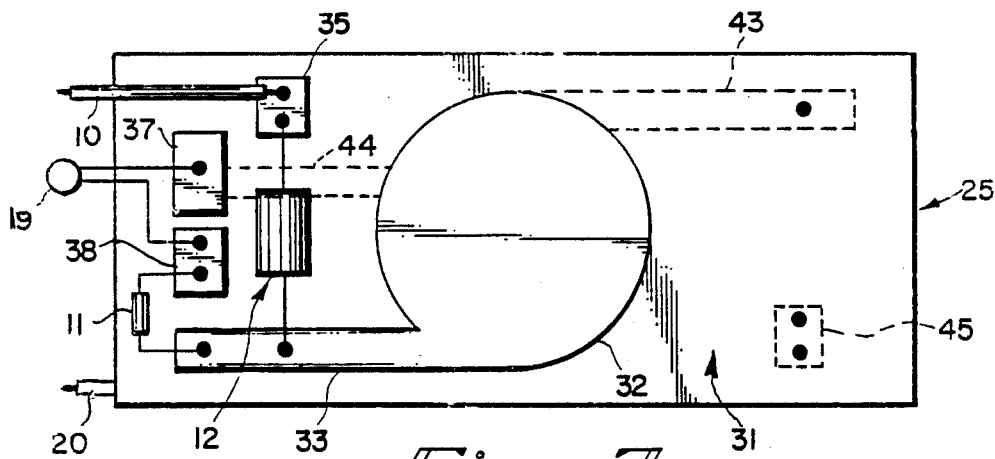
Fig. 3
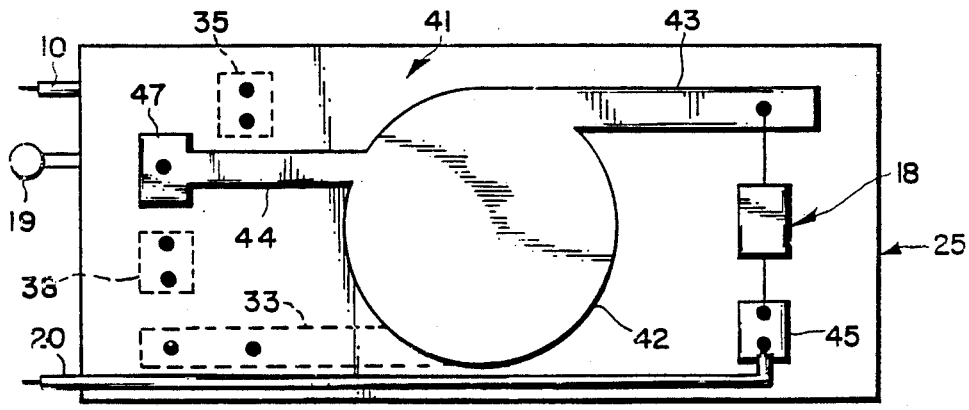
Fig. 4

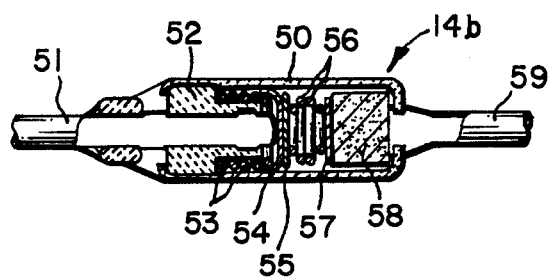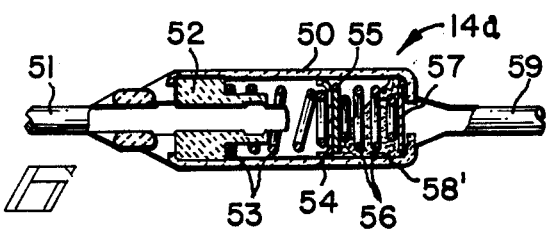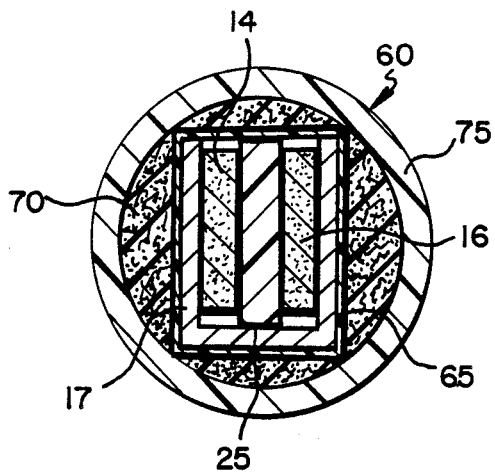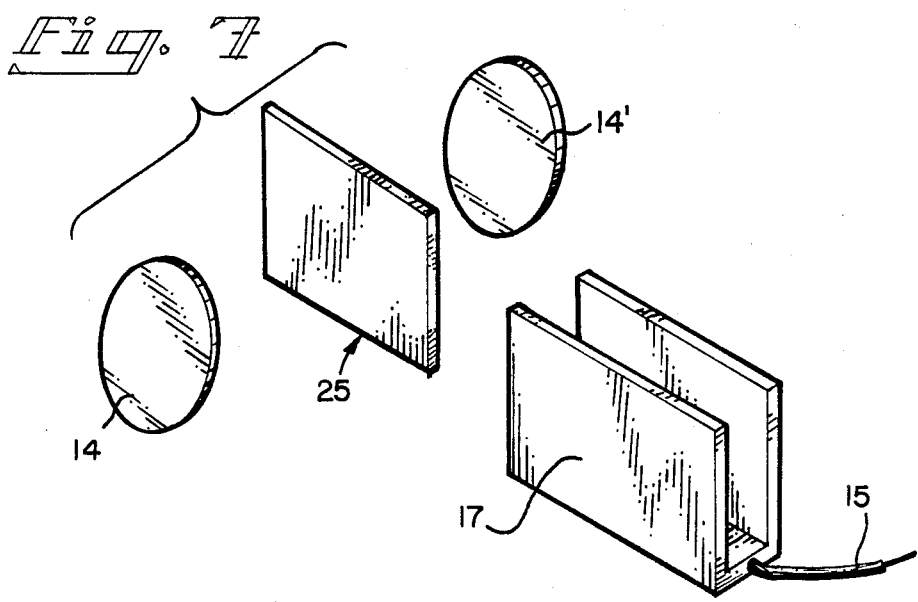

4,866,560

SAFEGUARDING ELECTRICAL TRANSIENT SURGE PROTECTION

FIELD OF THE INVENTION

This invention relates to protection of electrical equipment from transient surges in voltage, as from an external power source, and especially to safeguarding surge-protection apparatus from a potential catastrophic failure when on-line along with the usual watt-hour meter just upstream of an electrical customer's location.

BACKGROUND OF THE INVENTION

The desirability of protecting electrical meters and related equipment from transient voltage surges is well known. Earlier efforts to do so relied mainly upon current-limiting devices, such as fuses and circuit breakers, which open the circuit at excessive current flows. Examples of such use in a switch housing adjunct to a watt-hour meter appear in St. John U.S. Pat. No. 2,606,232.

Voltage-limiting protection can be provided by devices whose electrical resistance varies non-linearly under applied voltage so that conduction therethrough is slight at normal power voltages but disproportionately high at higher voltages. "Varistor" is commonly—and suggestively—applied as a name for such devices.

Varistors connected to provide such surge protection, as by shunting excess surge voltage and resulting current to an external ground, have been installed within meters, as in Melanson U.S. Pat. No. 3,914,657 and in Zisa U.S. Pat. No. 3,725,745; also in plug-and-jack devices adapted for use between electrical outlets and appliances to be operated from such outlets, as in Orfano U.S. Pat. No. 4,089,032.

The present inventor was the first person to provide voltage-limited surge-protection apparatus of the visitor type in meter adapters, as disclosed in his copending U.S. patent application Ser. No. 923,524 filed 28 Oct. 1986—which is incorporated herein by this reference. He has also devised a number of varistor arrangements for protecting watt-hour meters and metered downstream electrical loads from the deleterious effects of such surges. The electrical utility industry, thus awakened to the practicality of doing so, is now taking such protective steps increasingly rapidly.

Whatever degree of protection varistors may provide against electrical surge damage, the prior art has made little provision to save varistors themselves when subjected to surge overloads, which in severe cases can overheat any varistor to the point of failure. The present inventor's patent application mentioned above discloses heat-sink means to provide a degree of protection as surge currents impart thermal energy to the varistors and their local environment. However, a substantial need remains for augmenting protection of varistors or similar over-voltage surge-protection devices, and the present invention is directed to meeting that need in a noval way.

SUMMARY OF THE INVENTION

In general, thee objects of the present invention are attained using voltage-limiting devices, specifically varistors, to protect watt-hour meters and downstream loads from electrical surges, and so as to protect such varistors from overheating. In particular, this invention provides themally sensitive means to interrupt the incoming power as the varistors approach failure temperature.

A primary object of the present invention is to safeguard varistors as over-voltage surge-protection devices from overheating to failure temperature and perhaps failing catastrophically.

Another object of this invention is to enhance the protection of watt-hour meters and downstream electrical loads from transient surge damage without modifying such meters and with little or no modification of sockets conventionally used at customer's locations.

A further object is to provide such surge-protection apparatus and methods effectively and economically.

Yet another object is to provide a visible indication of the operational status of such a surge-protection device.

A still further object is to provide such surge-protection readily in locations as diverse as a power line weatherhead, a watt-hour meter base, an adapter between such a meter base and its normal mounting socket, and a circuit-breaker panel downstream of the meter and upstream of electrical loads metered thereby.

Other objects of the present invention, together with means and methods for attaining the various objects, will be apparent from the following description and the accompanying diagrams of embodiments presented by way of example rather than limitation.

SUMMARY OF THE DRAWINGS

FIG. 1 is a schematic electrical circuit useful according to this invention, including varistor means plus means for protecting the varistor means;

FIG. 2 is another schematic electrical circuit diagram for surge-protection according to this invention;

FIG. 3 is an elevation of a first face of circuit board apparatus with some components according to the schematic circuitry of FIG. 1;

FIG. 4 is an elevation of the opposite face of the circuit board apparatus of FIG. 3;

FIG. 5 is a medial longitudinal section through intact thermal cutoff means useful in apparatus of preceding and subsequent views;

FIG. 6 is a similar section through thermal cutoff means of FIG. 5 after actuation by excessive temperature;

FIG. 7 is a pre-assembly exploded view of the apparatus of FIGS. 3 and 4 plus two flanking varistors and a grounding clip;

FIG. 8 is an end elevation of the apparatus of FIG. 7 assembled with a wrapper and potting material in a housing;

DETAILED DESCRIPTION

Figure 9:
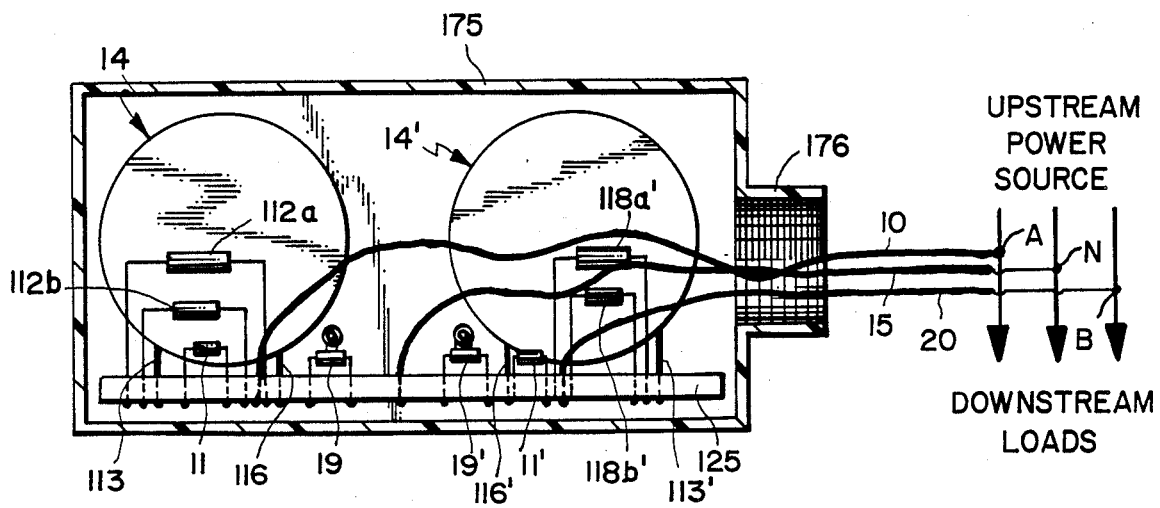
FIG. 9 is a side elevation, partly in section, according to the schematic circuitry of FIG. 2 and within another housing.

FIG. 1 shows in schematic form an electrical surge-protection circuit of this invention. Power line 10 for phase A and power line 20 for phase B contain respective thermal cutoff fuses 12 and 18. Downstream from the thermal cutoff fuses, varistors 14 and 14' are connected between neutral line 15 and respective power lines 10 and 20. Also downstream from the thermal cutoff fuses, light-emitting diode (LED) 19 in series with current-limiting resistor 11 is connected between power lines 10 and 20.

FIG. 2 shows similarly a modification of the apparatus of the preceding view utilizing pair of such LED's 19, 19' connected to neutral (N) line 15, and their respective series resistors 11, 11' connected to respective lines 10 and 20 (for phases A and B).

FIG. 3 shows first (phase A) face 31 of circuit board 25, with conductive surface layer portions shown on this side in solid lines (and with conductive surface layer portions on the opposite face indicated in broken lines). Small solid circles on such conductive portions are electrical tie points. Conductive circular body 32 is a "lazy b" in outline, with its "b" stem 33 extending horizontally to the left toward—but not quite to—the left edge. Above the end of the stem are upper and lower contact strips 37 and 38. Mounted by leads onto this side of the board is a first thermal cutoff fuse 12, located laterally between contact strip 37 and conductive body 32, being interconnected at its opposite ends by respective leads to "b" stem 33 and to phase A imput contact strip 35 located near the top edge of the board. Lead 10 extends from that same strip horizontally to the left, past the edge of the board to the phase A power lead (not shown).

Spaced off the left edge of the circuit board in FIG. 3 is LED 19, with its pair of leads interconnecting it to respective lower and upper contact strips 38 and 37 (the latter being fed from the opposite side of the board). LED resistor 11 connects by leads at its opposite ends to lower strip 38 and stem 33. Also indicated in broken lines because it is a conductive layer on the opposite face of the board is contact strip 43 at the upper right. Contact strip 45 (for phase B) is similarly shown at the lower right in this view of the first or phase A side of the circuit board.

FIG. 4 shows opposite side 41 of circuit board 25, having a similar conductive circular body 42 but with its stem 43 extending along but spaced from the top edge horizontally toward—but not quite to—the right edge of the board and with a smaller strip extending from the body to connection with contact strip 47 at the left—which connects (through the board) to like strip 37 on the opposite side of the board (FIG. 3).

Mounted to this phase B side of the board in FIG. 4 is second thermal cutoff fuse 14' alongside body 42 and below the main stem, being interconnected at its opposite ends by leads to stem 43 and to phase B input contact strip 45, respectively. Lead 20 for connection to the phase B power lead (not shown) turns from the contact strip to the left and past the left edge of the board.

FIGS. 5 and 6 show one of the two identical thermal cutoff fuse means. FIG. 5 lables it 14b (for "before" actuation), and FIG. 6 lables it 14a (for "after" actuation). Acutation of such means renders it inoperative thereafter and, of course, interrupts the previously continuous conductive path in which it was a part.

FIG. 5 shows cutoff means 14b—before actuation—with left and right conductive leads 51 and 59 extending from opposite ends of tubular non-conductive jacket 50. Inside, collar 52 surrounds the left, and helical compression spring 53 surrounds the right, half of left lead 51, which terminates in contact 54. The right inside end of jacket 50 is occupied by a quantity of fusible material 58 in granular form held compacted by helical compression spring 56 between right conductive disk 57, abutting such material, and left conductive disk 55 abutting contact 54.

FIG. 6 shows cutoff means 14a—after actuation—differing from the preceding view in consequence of melting and flow of the fusible material (now designated 58') and consequent displacement of spring 56 into the space occupied by such material in its previous solid form. Spring 53 also expands and spaces contact 54 from the end of lead 51. The resulting discontinuity of conductive material between the respective conductors interrupts the circuit to either varistor shown schematically in FIG. 1 and physically in the next two views.

FIG. 7 is pre-assembly exploded view of such surge-protection means of the present invention, including circuit board 25 (but not showing the components on it) varistors 14 and 14' flanking the board, and U-clip 17 (plus lead 15) adapted to fit over the varistors when against the board. Not shown in this—but shown in the next—view are shrink-wrap 65 to envelope the varistors and adjacent parts of the circuit board, thermally—not electrically—conductive potting material 70, and housing 75 to surround everything but the ends of phase A and B leads 10 and 20 and grounding lead 15, and also LED 19 protruding from the housing to the exterior (FIGS. 3 and 4).

FIG. 8 is an edgewise sectional view of resulting assembly 60 utilizing circuit board 25 of FIGS. 3 and 4. Varistors 14 and 14' are shown sandwiching circuit board 25 and being held in such relationship by U-shaped clip 17 fitting closely thereover in conductive contact with the otherwise exposed outside faces of the varistors. Grounding lead 15 attached to the base of the U extends past the left edge of the board parallel to lead 20. In practice the arms of the U may be doubled back inside to smooth the edges and to accentuate the springiness of the clip so as to retain the varistors and the conductive layers on the circuit board in contact till completion of the assembly and packaging of all the components.

Operation of the surge-protection means of this invention is readily understood. The LED, which is visible at a glance, will glow so long as the circuit from the power source to the varistors is complete—and not if the circuit is interrupted for any reason.

Voltage surges induced by lightning flashes or other electromagneti disturbances onto the power lines, when received on the power input leads are clipped due to the increased conductivity of the varistors at such increased voltages. The resulting current is bled harmlessly off to ground through the neutral lead. The thermal energy resulting from such current flow is manifested as an increase in temperature. Over time such temperature increase equilibrates (by gradual conduction, convection, and radiation) with the presumably lower temperature prevailing outside.

It is quite possible that large temperature increases from excessively frequent and/or high surges could heat the varistors to a runaway failure mode of conduction—which might result in an explosive failure of the housing and physical damage to a watt-hour meter or electrical load in the vicinity and even a fire. For this reason the thermal cutoff fuses interposed in the power leads to the varistors are designed so as to be actuated at a somewhat lower temperature, thereby interrupting the power circuit before such catastrophic failure can occur. A lack of glow from the LED indicates—if power input is present—that at least one of the thermal cutoff means has to be replaced, and that the varistors should be examined and be replaced, and that the varistors should be examined and be replaced if at all damaged.

Such thermal cutoff fusible means should not be confused with ordinary current-limiting fuses, which fail when the temperature from current passing through them reaches their melting point. Though current resulting from power line voltage surges may be hundreds or even thousands of amperes, the surges usually are so brief that the $I^2 R$ energy from the IR drop in such fuse itself heats it only slightly. Current-limiting fuses not in such intimate thermal proximity to whatever equipment is intended to be protected would melt at much lower temperatures than are required to cause varistor failure.

Figure 10:
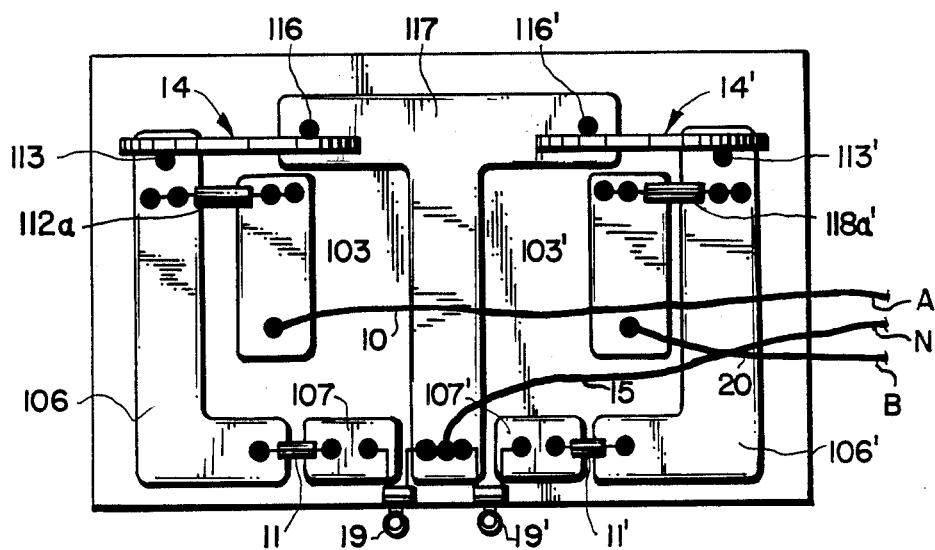
FIG. 10 is a plan view of components from FIG. 9.

FIGS. 9 and 10 illustrate another embodiment of this invention but with circuitry as in FIG. 2. FIG. 9 shows it in elevation, in a housing shown in section, and FIG. 10 in plan on an enlarged scale without the housing. Components substantially identical to those in the other embodiment have unchanged reference numerals in these views, whereas components corresponding generally to previous ones are designated by addition of 100 to previous reference numerals. A component lacking an antecedent in the previous embodiment will have a 100-series number without any two-digit predecessor there. Where components are paired, the numeral for the component at the right (Phase B) is the same as the numeral at the left (phase A) but with a prime added thereto to distinguish it.

FIG. 9 shows generally rectangular housing 175 terminating at the right in nipple 176. Circuit board 125 lies horizontally near the housing bottom wall, with the circuit elements for both phases visible simultaneously, those for Phase A at the left and those for Phase B at the right of a vertical bisector (not shown) aligned with attachment of lead 15 to ground plane 117 (see FIG. 10). The lead itself exits via the open nipple to join the neutral (N) line from a remote power source upstream. Pair of LED's 19, 19' flank the ground lead, each having one lead attached to T-shaped ground plane 117, having their opposite leads attached to circuit strips 107, 107', respectively, from which the LED's respective series resistors 11, 11' interconnect to L-shaped contact strips 106, 106'. As suggested in FIG. 10, the visible light portion of each of the LED's extends past the edge of the circuit board toward an opening (not shown) in the housing so as to be visible from the outside. Pair of varistors 14, 14' are upstanding above the circuit board, on respective leads 116, 116', at opposite corners of ground plane 117, and leads 113, 113' from the tops of respective contact strips 106, 106'. Such supporting leads connect to conductive layers on the respective faces (covered here) of the dislike varistors.

In this embodiment each varistor has a pair of parallel thermal cutoff fuse means closely adjacent: 112a and 112b for varistor 14, and 118a' and 118b' for varistor 14'. Each of them in the first pair bridges contact strip 106 and nearby contact strip 103; and each of the second pair of thermal cutoff means similarly bridges adjacent contact strips 106' and 103'. Lead 10 connects contact strip 103 to the phase A line, whereas lead 20 connects contact strip 103' to the phase B line (from an upstream power source to downstream loads).

In operation, this embodiment is substantially the same as the previous embodiment. Of course, the dual LED arrangement provides an indicator light for each phase's varistors rather than only a single collective indicator as previously. The housing nipple is an aid to attaching the apparatus to a utility box or panel.

The varistors themselves are generally available articles of commerce, usually comprising sintered metallic compositions, such as zinc oxide or silicon carbide, in disklike form with a narrow surrounding band of insulating material. They are provided in various sizes and with various electrical characteristics, as by General Electric Company, for example. Selection of appropriate varistors for surge-protection means of this invention is within ordinary skill of persons familiar with the surge-protection art.

Similarly, suitable thermal cutoff fuses are also readily available, as from Therm-O-Disc under the designation "Microtemp" and from NEC under the designation "Sefuse".

The U-clip usually is metallic, for good conduction of surge current to the ground lead. Aluminum and copper are good choices. Mental-clad non-conductive materials of sufficient current capacity may be substituted but are not preferred.

The shrink-wrap material to envelope the U-clip and parts of the circuit board covered by the U-clip is readily available and may be any of a wide variety of thermoplastic materials, such as polyethylene or polypropylene, for example.

As noted, the potting material should be thermally conductive but electrically non-conductive, and many compositions meet such requirements. Thermosetting materials are preferred, such as epoxy resins, which tolerate much higher temperatures than the fuses do. Such resins are readily available in granular or powder form that will become a rigid solid when heated and cured in normal manner.

The housing may be made of any suitable material, preferably non-conductive, and indeed may be of the same thermosetting resin as the potting material (already set, of course) or suitable cast, extruded, or otherwise formed material. The dimensions of the housing are modest, such as about a half dozen to a dozen or so centimeters in outside width and length, several centimeters in depth, and a couple millimeters in wall thickness—or about the size and shape of an ordinary cigarette package. The housing may be equipped with convenient mounting means, such as a threaded nipple to fit within a knockout on an electrical box or panel.

Advantages and benefits of the surge-protection means and methods, and of the safeguarding means and methods for such surge-protection means or for more conventional over-voltage protection means have been mentioned in the foregoing text and are otherwise readily apparent. Other benefits may accrue to users thereof.

Modifications of the invention have been described and shown here. Other changes may be made therein, as by adding, combining, deleting, or subdividing parts or steps, while retaining at least some of the advantages and benefits of this invention—which itself is defined in the following claims.

The claimed invention:

1. Accessory means for protecting without intentional arcing against electrical surge damage, such as from lightning or other transient source, being insertable between input power terminals and downstream electrical equipment, comprising
   a pair of varistor means,
      electrically connected at one face to respective input power terminals via a first path, and electrically connected at the opposite face to an available external ground connection via a second path; and a pair of current-carrying fusible cutoff means adjacent thereto
responsive to the temperature of such varistor means,
series interconnecting such respective input power terminals to such varistor means, and
fusing open and thereby discontinuing the circuit to such varistor means if and when the temperature of such varistor means rises above a safe conduction temperature range.

2. Surge-protection accessory means according to claim 1, including
housing means enclosing such accessory means, and
a plurality of conduction indicator means protruding from the housing to the exterior.

3. Surge-protection means according to claim 2, wherein the indicator means comprises a light-emitting diode between fused powder and ground, 4. Surge-protection means according to claim 2, wherein the indicator means are interconnected to ground from the respective junctions of the varistor means to the fusible cutoff means.

5. Method of safeguarding surge-protection varistors, when connected to ground from respective junctions of powder input lines to electrical equipment so powered, from overheating to temperature at which such varistors would fail physically, comprising the steps of
connecting, in series between respective power input lines and such varistors,
electrically conductive thermally sensitive means adapted in part to melt and to cease conducting electrical current at a temperature near but somewhat below the varistor failure temperature;
locating such thermally sensitive means sufficiently close to at least one of the varistors to sense the temperature thereof and be so heated; and
enclosing such varistors in a non-conductive housing.

6. Method of safeguarding surge-protection varistors, when connected to ground from respective junctions of power input lines to electrical equipment so powered, against overheating to a temperature at which such varistors would fail physically, comprising the steps of
connecting, in series between respective power input lines and such varistors, electrically conductive thermally sensitive means adapted in part to melt and to cease conducting electrical current at a temperature near but somewhat below the varistor failure temperature;
locating such thermally sensitive means sufficiently close to at least one of the varistors to sense the temperature thereof and be so heated; and
enclosing such varistors in a non-conductive housing, and filling the interior of the housing with thermally conductive but electrically non-conductive potting material.

7. Varistor-safeguarding means according to claim 6, including indicator means connected across such power input lines and protruding from the housing.

8. Varistor-safeguarding means according to claim 7, wherein such indicator means is connected from a power input line to ground.

9. Varistor-safeguarding means according to claim 7, including one such indicator means for each ungrounded power input line.

10. Solid-state mean for safeguarding surge-protection varistor means, when connected to ground from a junction of a power input line to electrical equipment so powered, from overheating to a temperature at which such varistor means would fail physically, comprising
a circuit board having mounted thereon, in series circuit between the power input line and the varistor means,
electrically conductive thermally sensitive means having a part adapted to cease conducting electrical current from such imput line to such varistor means at a temperature near but below such varistor means failure temperature,
so located relative to the varistor means as to sence the temperature of the varistor means and be heated thereby.

11. Varistor-safeguarding means according to claim 10, including in such varistor means
a pair of varistors, one each for each of a pair of such power input lines, each varistor having a pair of conductive faces,
the circuit board including electrically conductive contact surfaces on opposite sides thereof for contact with conductive faces of the respective varistors.

12. Means for safeguarding surge-protection varistor means, when connected to ground from a junction of a power input line to electrical equipment so powered, against overheating to a temperature at which such varistor means would fail physically,
comprising a circuit board having mounted thereon, in series circuit between the power input line and the varistor means,
electrically conductive thermally sensitive means having a part adapted to melt and to cease conducting electrical current from such input line to such varistor means at a temperature near but below such varistor means failure temperature,
so located relative to the varistor means as to sense the temperature of the varistor means and be heated thereby;
the varistor means including a pair of varistors, one each for each of a pair of such power input lines, each varistor having a pair of conductive faces;
the circuit board including electrically conductive contact surfaces on opposite sides thereof for contact with conductive faces of the respective varistors; and
grounding clip means adapted to straddle the circuit board and the varistors in contact with the respective contact surfaces on the circuit board and further adapted to make electrical contact with the respective faces of the varistors opposite the faces thereof in contact with the contact surfaces on the circuit board.

13. Varistor-safeguarding means according to claim 12, including a layer of electrically non-conductive means surrounding the grounding clip means, the varistors, and the adjacent part of the circuit board.

14. Varistor-safeguarding means according to claim 13, wherein the layer of electrically non-conductive means is shrink-wrap.

15. Means for safeguarding surge-protection varistor means, when connected to ground from a junction of a power input line to electrical equipment so powered, against overheating to a temperature at which such varistor means would fail physically, comprising a circuit board having mounted thereon, in series circuit between the power line and the varistor means, electrically conductive thermally sensitive means having a part adapted to melt and to cease conducting electrical current from such input line to such varistor means at a temperature near but below such varistor means failure temperature, so located relative to the varistor means as to sense the temperature of the varistor means and be heated thereby; and including a pair of varistors, one each for each of a pair of such power input lines;

the circuit board including electrically conductive contact surfaces on a single side thereof with connection to one face of the respective varistors, and an electrically conductive ground contact surface with connection to the opposite face of the respective varistors.

16. Varistor-safeguarding means according to claim 15, wherein the varistors are upstanding from the circuit board.

17. Varistor-safeguarding means according to claim 16, wherein leads upstanding from the respective conductive contact surfaces on the circuit board are in contact with the respective faces of the respective varistors.

18. In surge-protection apparatus operable without reliance on over-voltage arcing and comprising varistor means connectable between input power lines and ground, the combination of a circuit board having a plurality of conductive surfaces for conductive contact with plurality of varistors, a plurality of double-sided varistors for contact along one side with respective conductive surfaces on the circuit board, means for retaining the respective varistors in contact with the respective conductive surfaces on the circuit board, and conductive means for contacting the opposite sides of the respective varistors.

19. Means of safeguarding an over-voltage surge-protection varistor, when connected to ground at a junction of a power input lead to electrical equipment so powered, against overheating to a temperature at which such varistor would fail physically, comprising electrically conductive thermally sensitive means adapted to cease conducting electrical current at a temperature near but somewhat below the varistor failure temperature, connected in series circuit between a power input lead and such a varistor, located proximately to such varistor to sense the temperature thereof and be heated thereby, and enclosed with such varistor in a non-conductive housing substantially filled with thermally conductive but electrically non-conductive potting material.

* * * * *

UNITED STATES PATENT AND TRADEMARK OFFICE
CERTIFICATE OF CORRECTION

PATENT NO. : 4,866,560

DATED : September 12, 1989

INVENTOR(S) : Edward F. Allina

It is certified that error appears in the above-identified patent and that said Letters Patent is hereby corrected as shown below:

Col. 1, line 38, "visitor" should be --varistor--.

Col. 1, line 60, "noval" should be --novel--.

Col. 1, line 63, "thee" should be --the--.

Col. 3, line 19, "imput" should be --input--.

Col. 3, line 53, "lables" should be --labels--.

Col. 3, line 54, "lables" should be --labels--.

Col. 3, line 55, "Acutation" should be --Actuation--.

Col. 4, line 11, "is pre-..." should be --is a pre-...--.

Col. 4, line 45, " electromagneti" should be --electromagnetic--.

Col. 4, lines 67-68, "and...replaced," should be deleted.

Col. 5, line 52, "dislike" should be --disklike--.

Col. 6, line 17, "Mental" should be --Metal--.

Col. 7, line 22, " powder" should be --power--.

Col. 7, line 29, "powder" should be --power--.

UNITED STATES PATENT AND TRADEMARK OFFICE
CERTIFICATE OF CORRECTION

PATENT NO. : 4,866,560

DATED : September 12, 1989

INVENTOR(S) : Edward F. Allina

It is certified that error appears in the above-identified patent and that said Letters Patent is hereby corrected as shown below:

Col. 8, line 4, "mean" should be --means--.

Col. 8, line 14, "imput" should be --input--.

Col. 8, line 17, "sence" should be --sense--.

Col. 10, line 4, "with plurality" should be --with a plurality--.

Signed and Sealed this

Fourteenth Day of August, 1990

Attest:

HARRY F. MANBECK, JR.

*Attesting Officer*　　　　　*Commissioner of Patents and Trademarks*